(12) United States Patent (10) Patent No.: US 7,642,692 B1
Pulskamp (45) Date of Patent: Jan. 5, 2010

(54) PZT MEMS RESONANT LORENTZ FORCE MAGNETOMETER

(75) Inventor: Jeffrey S. Pulskamp, Rockville, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 430 days.

(21) Appl. No.: 11/226,377

(22) Filed: Sep. 15, 2005

(51) Int. Cl.
*H01L 41/08* (2006.01)
(52) U.S. Cl. ..................................... 310/309
(58) Field of Classification Search ................ 310/309, 310/338, 316.01; 324/260, 244, 259; 73/590, 73/649, 662; *H01L 41/08*
See application file for complete search history.

(56) References Cited

U.S. PATENT DOCUMENTS

| 5,959,452 | A | 9/1999 | Givens et al. | |
|---|---|---|---|---|
| 6,819,103 | B2 * | 11/2004 | Champion et al. | 324/260 |
| 7,042,213 | B2 * | 5/2006 | Greywall | 324/244 |
| 2004/0150398 | A1 * | 8/2004 | Champion et al. | 324/260 |

OTHER PUBLICATIONS

Wickenden, D. et al., "An Extremely Sensitive MEMS Magnetometer for Use as an Orientation Sensor on Projectiles," Royal Aeronautical Society Conference, "Nanotechnology and Microengineering for Future Guided Weapons," Nov. 11, 1999, pp. 7-1 through 7-9.

* cited by examiner

*Primary Examiner*—Walter Benson
*Assistant Examiner*—Karen B Addison
(74) *Attorney, Agent, or Firm*—Edward L. Stolarun; A. David Spevack; Alan Ivan Kalb

(57) ABSTRACT

A MEMS magnetometer comprises a deflectable resonator comprising a base layer; a Lorentz force (LF) drive conductor attached to the base layer; and a piezoelectric sensor attached to the base layer and electrically isolated from the LF drive conductor. The LF drive conductor comprises conductive material configured for receiving a current at a mechanical resonant frequency of the device capable of causing mechanical deformation of the deflectable resonator, wherein the current causes formation of Lorentz forces in a presence of a magnetic field, and wherein the deflectable resonator is mechanically deformed as a result of the formation of the Lorentz forces. The mechanical deformation of the deflectable resonator generates a detectable piezoelectric electrical signal that is proportional to the magnitude of the magnetic field.

16 Claims, 11 Drawing Sheets

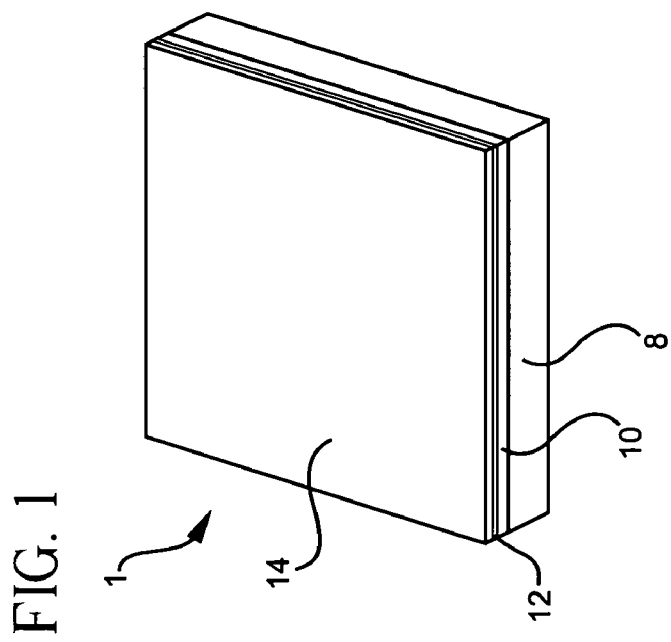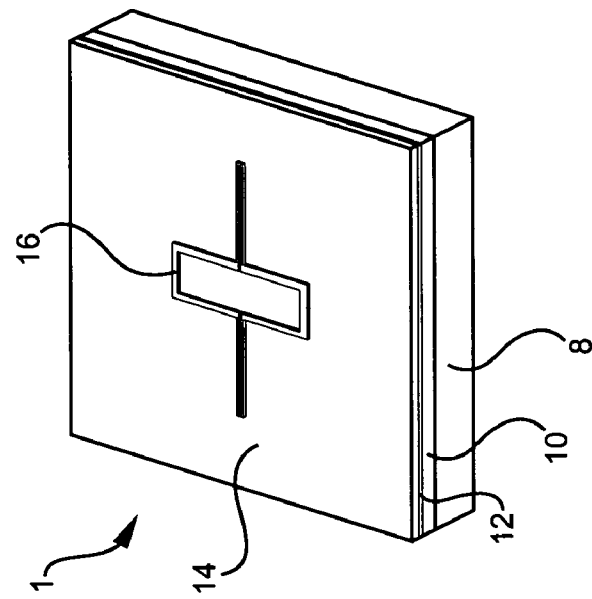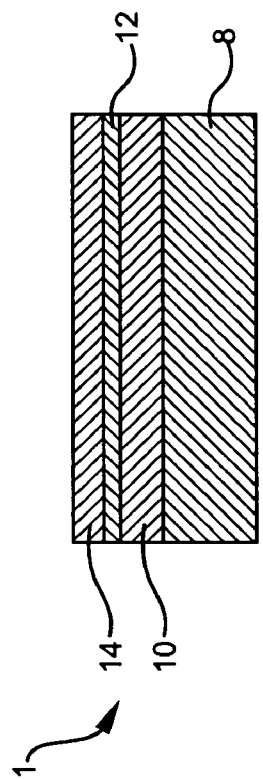

PZT MEMS RESONANT LORENTZ FORCE MAGNETOMETER

GOVERNMENT INTEREST

The embodiments of the invention described herein may be manufactured, used, and/or licensed by or for the United States Government.

BACKGROUND OF THE INVENTION

1. Field of the Invention

The embodiments of the invention generally relate to microelectromechanical systems (MEMS) devices and microelectronic devices, and, more particularly, to Lorentz force magnetometer devices.

2. Description of the Related Art

Conventional MEMS Lorentz force magnetometer designs, such as those described in U.S. Pat. No. 5,959,452, issued to Givens et al. on Sep. 28, 1999, the complete disclosure of which is herein incorporated by reference, describe both optical and capacitive transduction schemes. This capacitive design has achieved a sensor resolution of approximately 1 µT using a drive current of 1 mA and a Q-factor of 20,000, such as suggested by Wickenden et. al, "An Extremely Sensitive MEMS Magnetometer for use as an Orientation Sensor on Projectiles," Royal Aeronautical Society Conference, Nanotechnology and Microengineering for Future Guided Weapons, Nov. 11, 1999, the complete disclosure of which is herein incorporated by reference.

However, producing miniaturized optical MEMS devices, such as magnetometers, generally appears to present substantial technical challenges including overcoming size, weight, and power consumption parameters as well as attaining acceptable sensor resolution standards. In addition, the proposed piezoelectric devices appear to suffer from inappropriate design choices. Using the same electrode for driving the Lorentz force current and piezoelectrically sensing those Lorentz forces directly couples the drive and sense functions of the sensor; which generally prevents the measurement of external magnetic fields. This may also severely limit the maximum drive currents of the device due to the limited cross-sectional area and thermal/electrical material properties of the chosen conductor, platinum. Generally, the limited drive current directly limits the sensitivity and resolution of such a device.

Accordingly, there remains a need for a novel MEMS magnetometer device capable of mapping magnetic fields in various applications, and which is further capable of achieving size, weight, power consumption, and resolution parameters previously unattainable by the conventional designs.

SUMMARY OF THE INVENTION

In view of the foregoing, an embodiment of the invention provides a microelectromechanical system (MEMS) magnetometer comprising a deflectable resonator comprising a base layer; a Lorentz force (LF) drive conductor attached to the base layer; and a piezoelectric sensor attached to the base layer and electrically isolated from the LF drive conductor. In one embodiment, the deflectable resonator comprises a torsional loop configuration. The LF drive conductor comprises conductive material configured for receiving a current at a resonant frequency capable of causing mechanical deformation of the deflectable resonator, wherein the current causes formation of Lorentz forces in the presence of a magnetic field, and wherein the deflectable resonator is mechanically deformed as a result of the formation of the Lorentz forces. The piezoelectric sensor comprises a bottom electrode; a piezoelectric layer over and adjacent to the bottom electrode; a top electrode over and adjacent to the piezoelectric layer; and an isolator electrically isolating the bottom electrode from the top electrode. The MEMS magnetometer further comprises a first interconnect structure connected to the LF drive conductor; and a second interconnect structure connected to the piezoelectric sensor, wherein the second interconnect structure is electrically isolated from the first interconnect structure.

Another aspect of the invention provides a magnetometer comprising a base layer; a LF drive conductor attached to the base layer; and a piezoelectric sensor attached to the base layer and electrically isolated from the LF drive conductor, wherein the LF drive conductor comprises conductive material configured for receiving a current at a resonant frequency capable of causing mechanical deformation of the base layer, the LF drive conductor, and the piezoelectric sensor, wherein the current causes formation of Lorentz forces in the presence of a magnetic field, and wherein the base layer, the LF drive conductor, and the piezoelectric sensor are mechanically deformed as a result of the formation of the Lorentz forces. The piezoelectric sensor comprises a bottom electrode; a piezoelectric layer over and adjacent to the bottom electrode; a top electrode over and adjacent to the piezoelectric layer; and an isolator electrically isolating the bottom electrode from the top electrode. The magnetometer further comprises a first interconnect structure connected to the LF drive conductor; and a second interconnect structure connected to the piezoelectric sensor, wherein the second interconnect structure is electrically isolated from the first interconnect structure.

Another embodiment of the invention provides a method for detecting a magnetic field using a magnetometer comprising a deflectable resonator comprising a base layer; a LF drive conductor attached to the base layer; and a piezoelectric sensor attached to the base layer and electrically isolated from the LF drive conductor, wherein the method comprises placing the magnetometer in a magnetic field; applying a current to the LF drive conductor; and detecting a mechanical deformation of the deflectable resonator with a piezoelectrically generated electrical signal, wherein the amount of deformation of the deflectable resonator is proportional to the piezoelectric signal generated by the piezoelectric sensor, which is then proportional to the magnitude of the magnetic field. The deflectable resonator comprises a torsional loop configuration according to one embodiment of the invention.

Additionally, the LF drive conductor comprises conductive material configured for receiving the current at a resonant frequency capable of causing the mechanical deformation of the deflectable resonator. Moreover, application of the current causes formation of Lorentz forces. Furthermore, the deflectable resonator is mechanically deformed as a result of the formation of the Lorentz forces. The piezoelectric sensor, coupled mechanically to the LF drive conductor via the base layer, then detects this deformation. The piezoelectric sensor comprises a bottom electrode; a piezoelectric layer over and adjacent to the bottom electrode; a top electrode over and adjacent to the piezoelectric layer; and an isolator electrically isolating the bottom electrode from the top electrode. Also, the magnetometer further comprises a first interconnect structure connected to the LF drive conductor; and a second interconnect structure connected to the piezoelectric sensor, wherein the second interconnect structure is electrically isolated from the first interconnect structure.

Another aspect of the invention provides a method of forming a magnetometer, wherein the method comprises attaching a LF drive conductor to a base layer; attaching a piezoelectric sensor to the base layer; and electrically isolating the piezoelectric sensor from the LF drive conductor, wherein the LF drive conductor comprises conductive material. The piezoelectric sensor is formed by positioning a piezoelectric layer over and adjacent to a bottom electrode; positioning a top electrode over and adjacent to the piezoelectric layer; and positioning an electrical isolator between the bottom electrode and the top electrode. The method further comprises connecting a first interconnect structure to the LF drive conductor; and connecting a second interconnect structure to the piezoelectric sensor, wherein the second interconnect structure is electrically isolated from the first interconnect structure.

The embodiments of the invention provide a lead zirconate titanate (PZT) MEMS resonant Lorentz force magnetometer that avoids conventional design flaws and functions properly as a quasi-static or dynamic magnetic field sensor that is small in size, weight, power consumption, provides excellent sensor resolution, possesses a large dynamic range, and has a low cost of manufacturing.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 1 is a perspective view of an initial wafer stack used for processing a magnetometer device according to an embodiment of the invention;

FIG. 2 is a side view of the partially completed magnetometer device of FIG. 1 according to an embodiment of the invention;

FIG. 3 is a perspective view of a partially completed magnetometer device illustrating a first processing step according to an embodiment of the invention;

DETAILED DESCRIPTION OF PREFERRED EMBODIMENTS OF THE INVENTION

Figure 4:
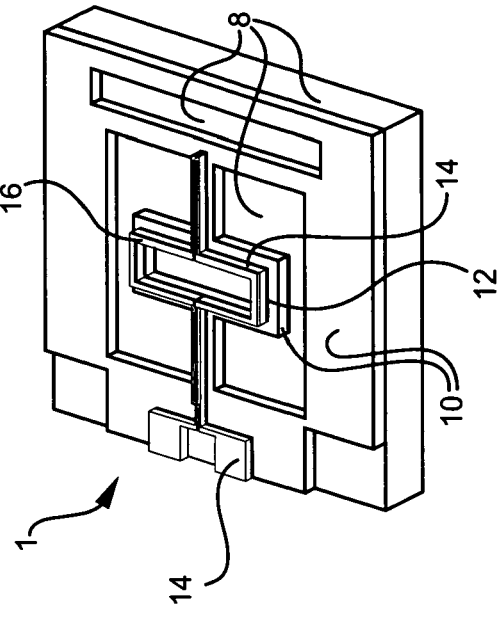
FIG. 4 is a perspective view of a partially completed magnetometer device illustrating a second processing step according to an embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a novel MEMS magnetometer device capable of mapping magnetic fields in various applications, and which is further capable of achieving size, weight, power consumption, and resolution parameters previously unattainable by the conventional designs. The embodiments of the invention achieve this by providing a PZT MEMS resonant Lorentz force magnetometer that avoids conventional design flaws and functions properly as a quasi-static or dynamic magnetic field sensor that is small in size, weight, power consumption, provides excellent sensor resolution, possesses a large dynamic range, and has a low cost of manufacturing. Referring now to the drawings and more particularly to FIGS. 1 through 21 where similar reference characters denote corresponding features consistently throughout the figures, there are shown preferred embodiments of the invention.

Figure 10:
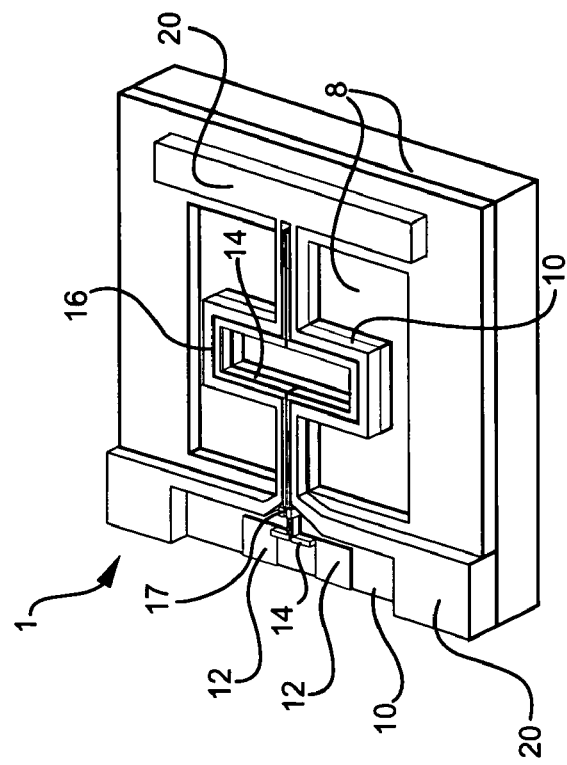
FIG. 10 is a perspective view of a partially completed magnetometer device illustrating a seventh processing step according to an embodiment of the invention.
Figure 11:
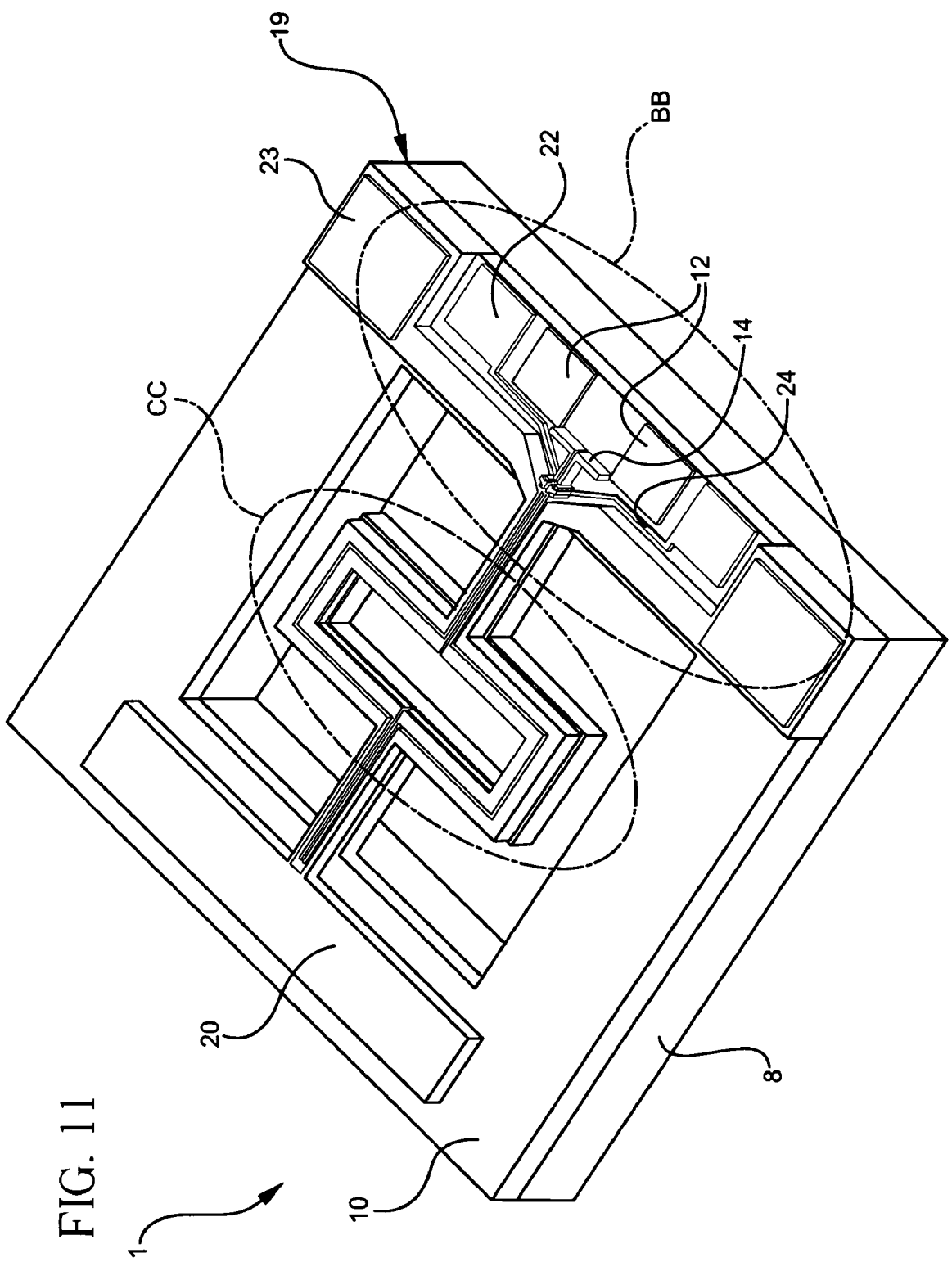
FIG. 11 is a perspective view of a completed magnetometer device illustrating a final processing step according to an embodiment of the invention.

The process for fabricating the PZT MEMS resonant Lorentz force magnetometer 1 is generally depicted in FIGS. 1 through 11, with the completed magnetometer device 1 shown in FIG. 11. Moreover, multiple options exist for process specifics of most of the processing steps, and the embodiments of the invention are not limited to one particular processing technique. As shown in FIGS. 1 and 2, the starting processing material is a silicon (Si) substrate wafer 8 having an approximate thickness of 450 μm. Next, a plasma enhanced chemical vapor deposition (PECVD) of silicon dioxide ($SiO_2$) is performed over the silicon wafer 8, thereby forming a $SiO_2$ base layer 10. The thickness of the silicon dioxide base layer 10 may vary between 0.5 μm and 2 μm in thickness, depending on the choice for the overall dimensions of the resonator, the thickness of the LF conductor, and the thickness of the PZT. Then, a titanium/platinum (Ti/Pt) bottom electrode 12 is sputter deposited over the $SiO_2$ base layer 10. The titanium layer is approximately 0.02 μm and the platinum layer is approximately 0.08 μm in thickness. Next, sol-gel lead zirconate titanate (PZT) 14 is spin coated over the Ti/Pt bottom electrode 12. The thickness of the PZT 14 may vary from 0.5 μm to 1 μm in thickness, again depending on the choice for the overall dimensions of the resonator, the thickness of the LF conductor, and the thickness of the base layer. While PZT is a preferred material, other piezoelectric materials could also be used in accordance with the embodiments of the invention.

FIG. 3 illustrates a liftoff process occurring with sputtered Pt of approximately 0.1 μm used to define the top electrode 16. Thereafter, as illustrated in FIG. 4, an ion milling process of the PZT layer 14 and Ti/Pt bottom electrode 12 occurs down to $SiO_2$ base layer 10. As shown in FIG. 4, portions of the PZT layer 14 remain as does the top electrode 16. This ion milling process generally provides electrical isolation of the subsequent sensor components of the magnetometer device 1.

Figure 5:
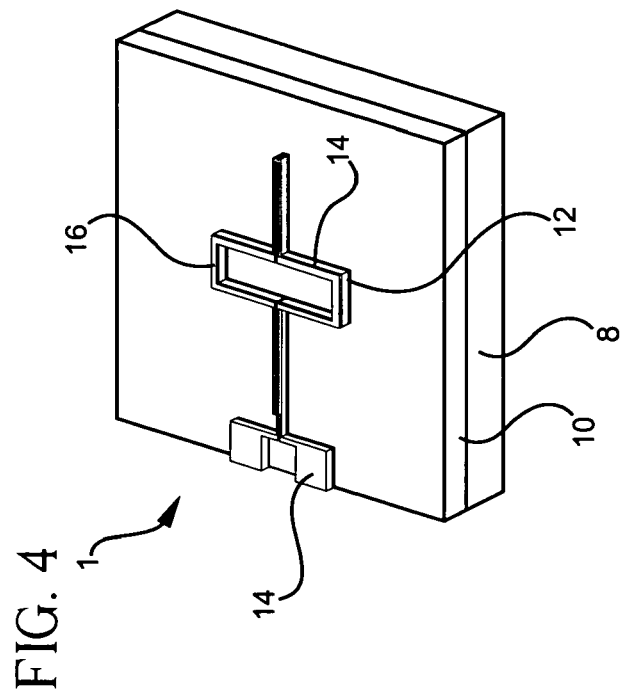
FIG. 5 is a perspective view of a partially completed magnetometer device illustrating a third processing step according to an embodiment of the invention.
Figure 6:
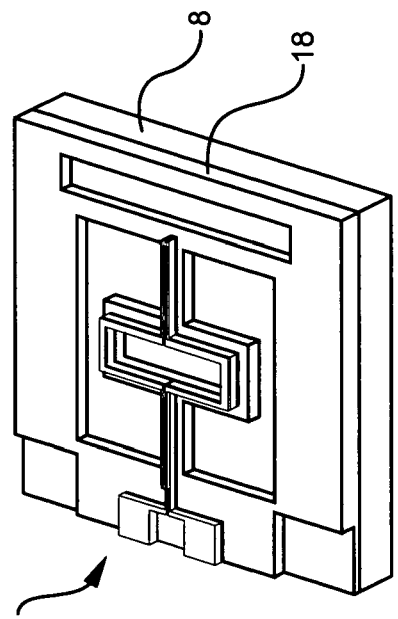
FIG. 6 is a perspective view of a partially completed magnetometer device illustrating a fourth processing step according to an embodiment of the invention.
Figure 7:
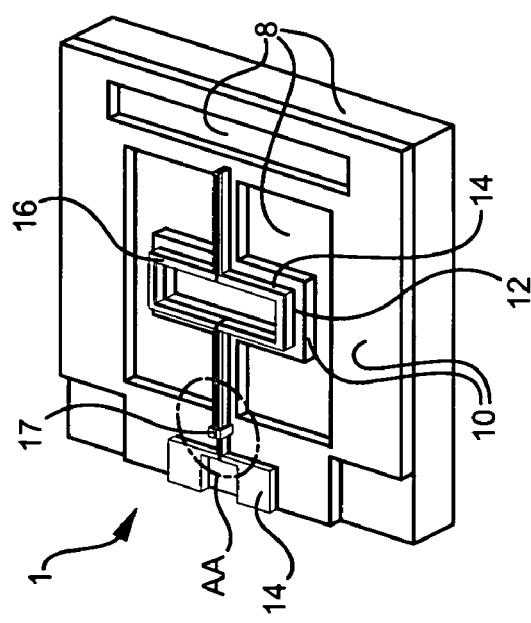
FIG. 7 is a perspective view of a partially completed magnetometer device illustrating a fifth processing step according to an embodiment of the invention.

Next, as depicted in FIG. 5, a reactive ion etching (RIE) process of the $SiO_2$ base layer 10 occurs down to the silicon substrate wafer 8, which helps define the subsequent resonator component of the magnetometer device 1 and enable its ultimate release from the silicon substrate wafer 8. In FIG. 6, a PECVD of a second $SiO_2$ layer 18 occurs over the exposed portions of the PZT layer 14, top electrode 16, Si substrate wafer 8, and the first $SiO_2$ layer 10. Next, as shown in FIG. 7, a RIE process occurs to remove the second $SiO_2$ layer 18 except for a small portion forming a pair of thin isolation posts (i.e., isolators) 17. The isolation posts 17, which comprise the second $SiO_2$ layer 18, are shown in the encircled dotted portion "AA" in FIG. 7, which is further illustrated with greater magnification in FIG. 8.

Figure 8:
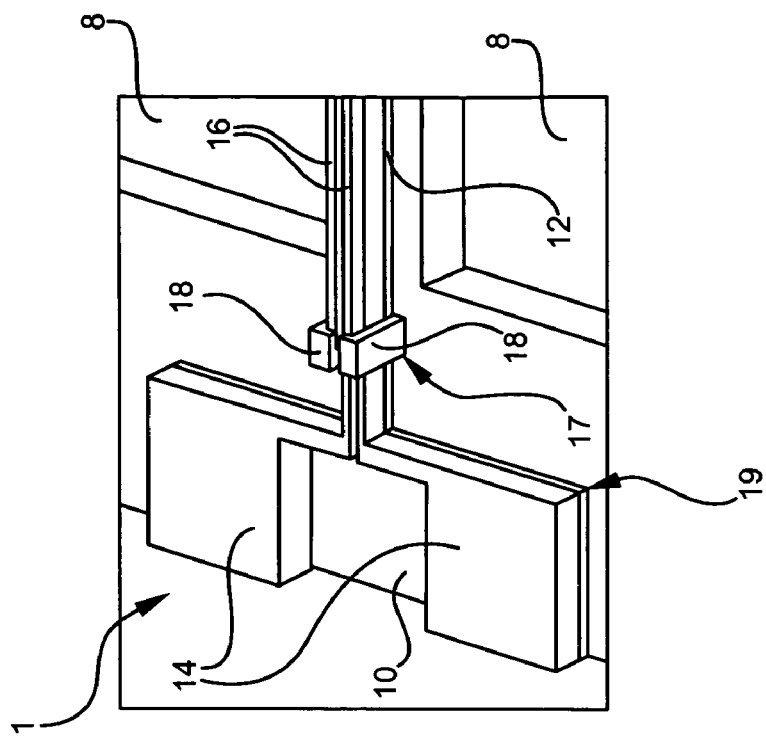
FIG. 8 is a magnified perspective view of the encircled dotted area "AA" of the magnetometer device of FIG. 7 according to an embodiment of the invention.
Figure 9:
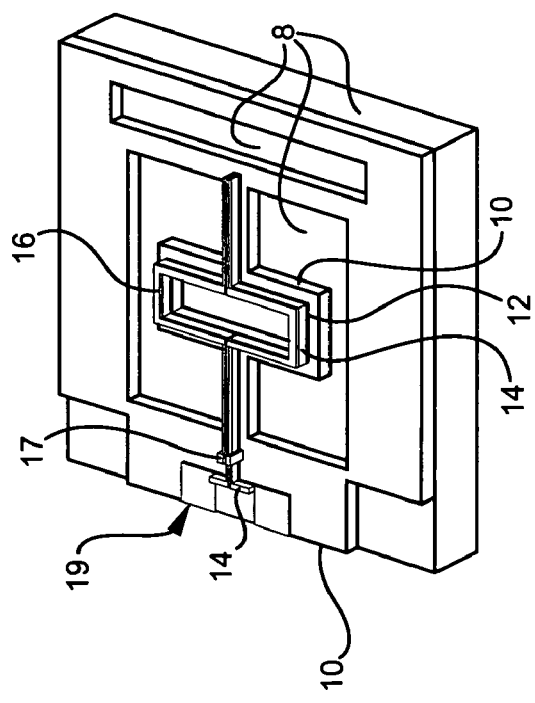
FIG. 9 is a perspective view of a partially completed magnetometer device illustrating a sixth processing step according to an embodiment of the invention.

As shown in FIG. 8, the isolation posts 17 surround a narrow anchored portion of the PZT layer 14 as well as an upper and side surface of a small portion of the top electrode 16 near the piezoelectric bond pad portion 19 of the magnetometer 1. The isolation posts 17 form a passivated path for subsequent top electrode traces to be deposited thereon. Without the isolation posts 17, the top and bottom electrodes 16, 12, respectively, would cause an undesirable short circuit in the magnetometer 1. Accordingly, this process allows the top electrode bond pads 23 (shown in FIG. 11) to be deposited onto the second $SiO_2$ layer 18 as opposed to the PZT 14 itself, which significantly reduces the parasitic capacitance of the top electrode bond pads 23, thereby reducing sensor noise. Thereafter, the PZT 14 is removed from the bottom electrode bond pad portion 19 via wet etching, as depicted in FIG. 9. As shown in FIG. 10, a highly electrical and thermally conductive material 20 such as titanium copper (TiCu) or titanium gold (TiAu) is deposited and patterned to form the Lorentz force (LF) drive conductor component 3 (shown in isolation in FIG. 14) of the magnetometer 1. The thickness of the conductive material 20 depends on the exact dimensions of the resonator, the thickness of the PZT layer 14, and the thickness of the $SiO_2$ base layer 10; but is typically between 1 μm and 2.5 μm. The LF drive conductor component 3 provides the path for the drive current loops around the perimeter of the magnetometer device 1. The completed magnetometer device 1 is shown in FIG. 11 upon formation (through well-known deposition and patterning techniques) of 0.5 μm of the TiAu top electrode bond pads 23 (formed over the bond pad portion 19), traces 24, and LF conductor bond pads 22. Finally, a xenon difluoride ($XeF_2$) isotropic etching process occurs to remove exposed portions of the silicon substrate wafer 8.

If the conductive material 20 is formed of TiCu, then the process occurs as generally described above. However, if the conductive material 20 is formed of TiAu, then the last two processing steps involving the formation of the LF drive conductor component 3 and the top electrode bond pads 23 may be combined because the same material (TiAu) is used for each respective formation. Generally, TiCu has superior thermal and electrical properties. Typically, TiCu generates approximately half of the heat that TiAu does. This enables a larger drive current to be supplied to the device, thereby resulting in greater sensor performance.

Figure 12:
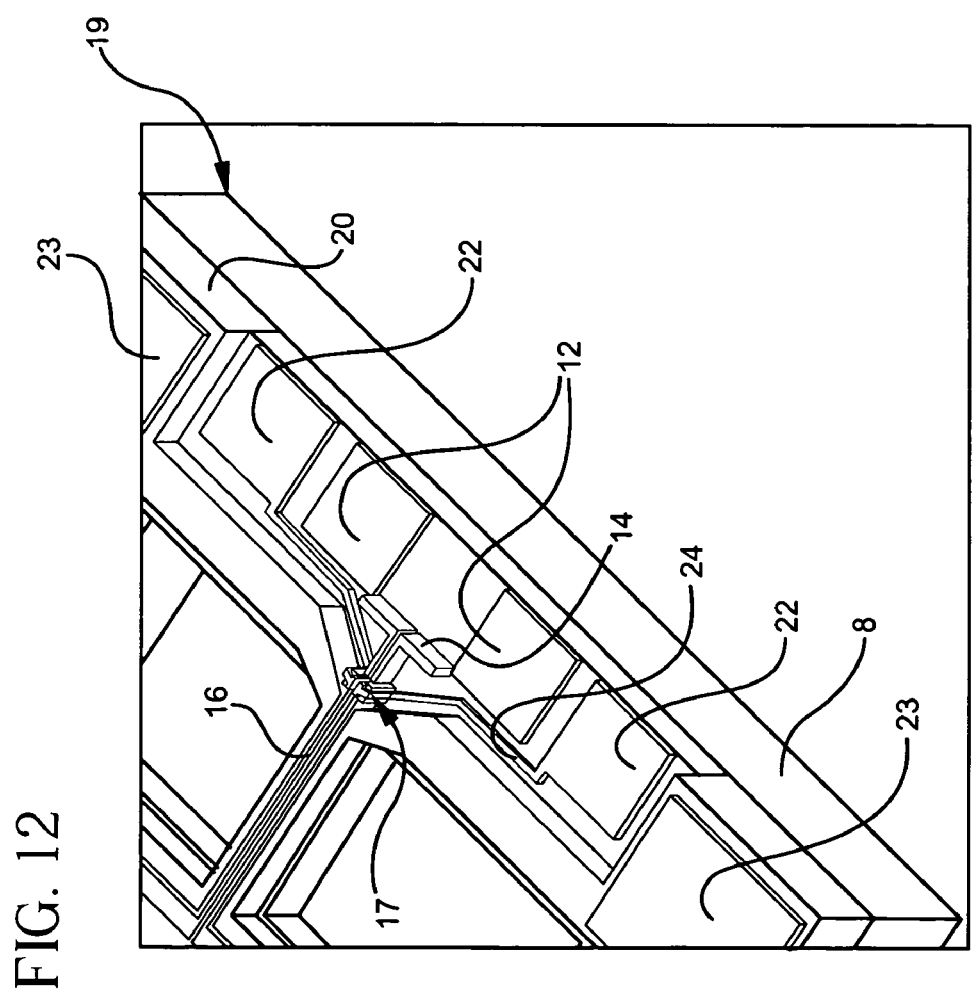
FIG. 12 is a magnified perspective view of the encircled dotted area "BB" of the magnetometer device of FIG. 11 according to an embodiment of the invention.
Figure 16:
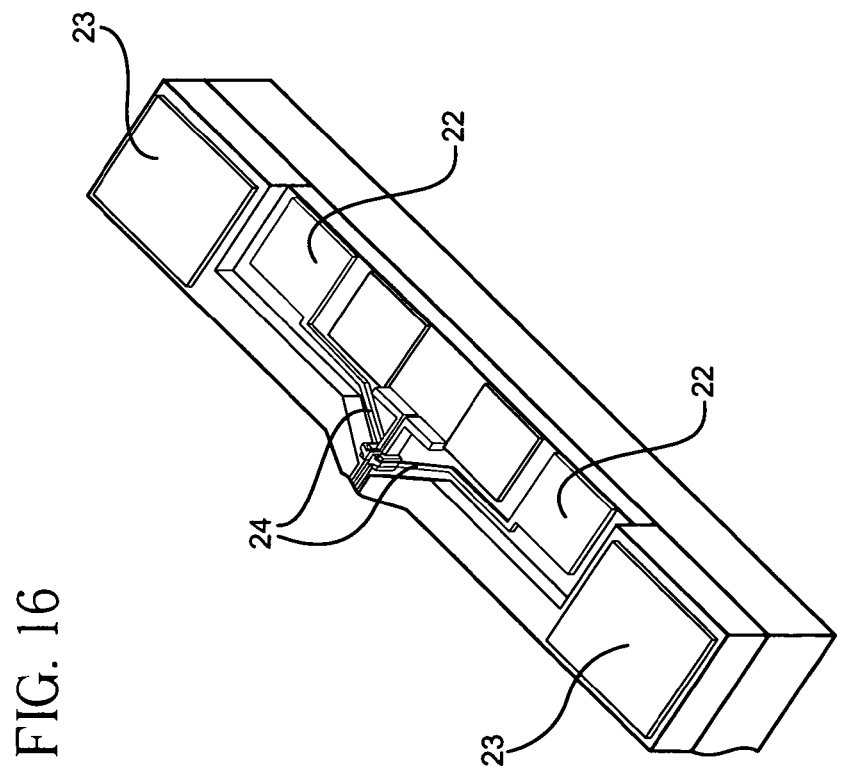
FIG. 16 is an isolated perspective view of the interconnect component of the magnetometer device of FIG. 11 according to an embodiment of the invention.

The various interconnect components such as the top electrode bond pads 23, traces 24, and LF conductor bond pads 22 are further illustrated in FIGS. 12 and 16, which are a magnified perspective view of the bond pad portion 19 (encircled dotted area "BB" shown in FIG. 11) of the magnetometer device 1 and an isolated perspective view of the interconnect components, respectively. The MEMS resonator component 2 of the magnetometer device 1 is shown in the isolated view shown in FIG. 13, which generally comprises the encircled dotted area "CC" of the magnetometer device 1 shown in FIG. 11. The MEMS resonator component 2 is released from the silicon substrate wafer 8 (not shown in FIG. 13) by the performance of the above-mentioned $XeF_2$ isotropic etching process. Thus, the MEMS resonator component 2 can be thought of as a free torsional current loop. However, other geometric configurations could also be used. For example, a clamped cantilever array design could be used (not shown) as well as other configurations depending on the particular application of the magnetometer 1.

Figure 13:
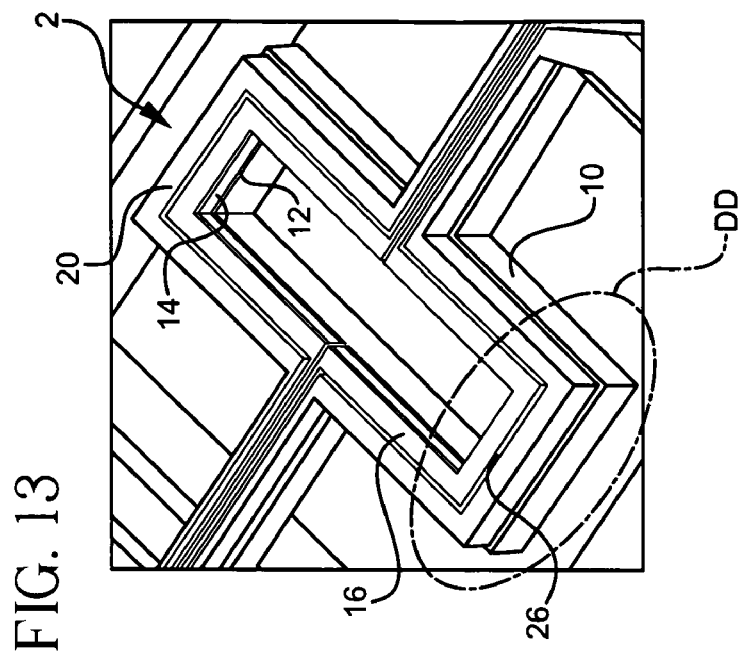
FIG. 13 is a magnified perspective view of the encircled dotted area "CC" of the magnetometer device of FIG. 11 according to an embodiment of the invention.
Figure 15:
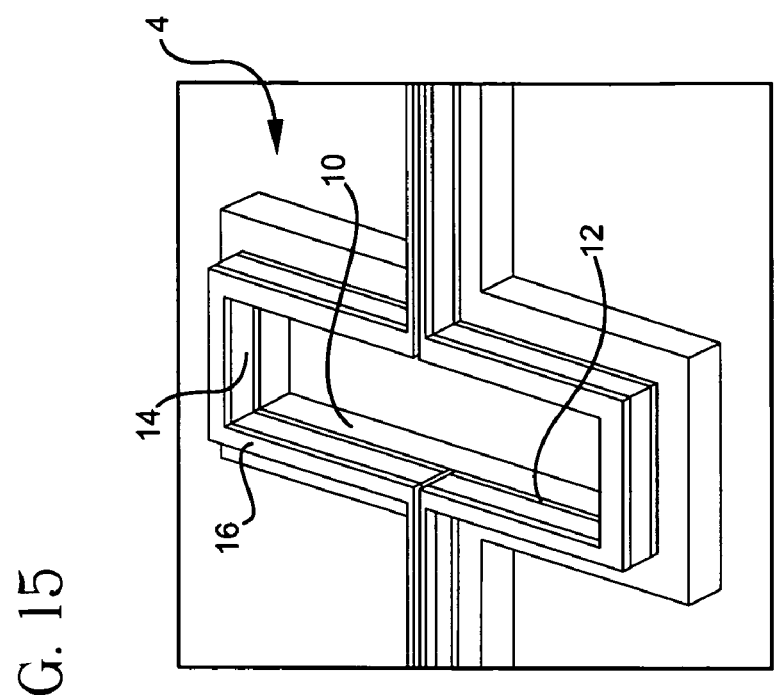
FIG. 15 is an isolated perspective view of the piezo sensor component of the magnetometer device of FIG. 11 according to an embodiment of the invention.
Figure 14:
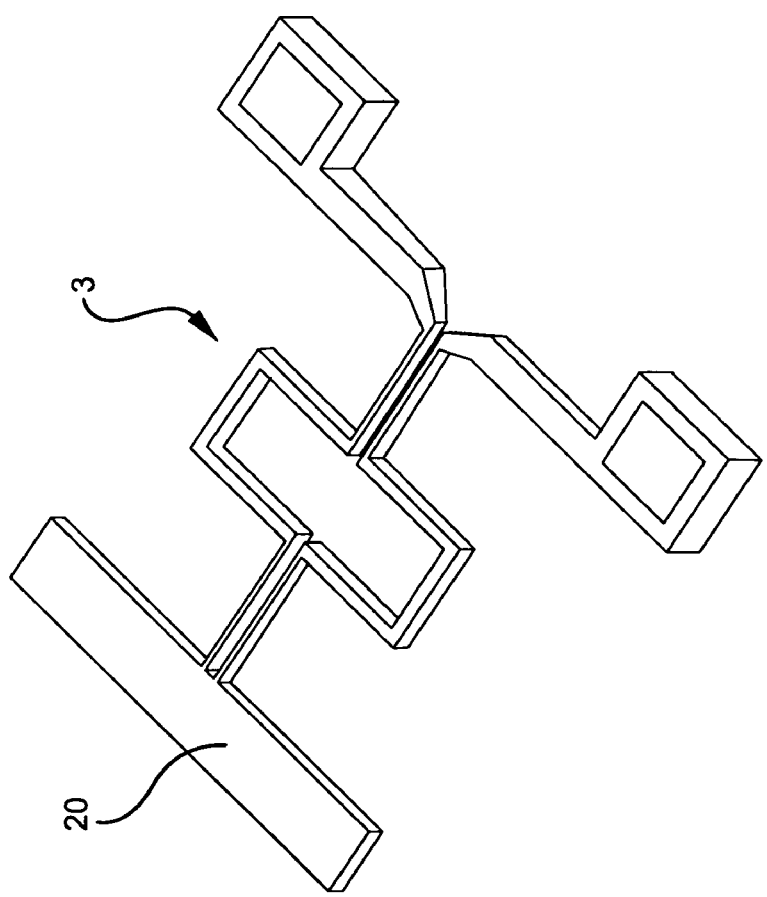
FIG. 14 is an isolated perspective view of the Lorentz force drive conductor component of the magnetometer device of FIG. 11 according to an embodiment of the invention.
Figure 17:
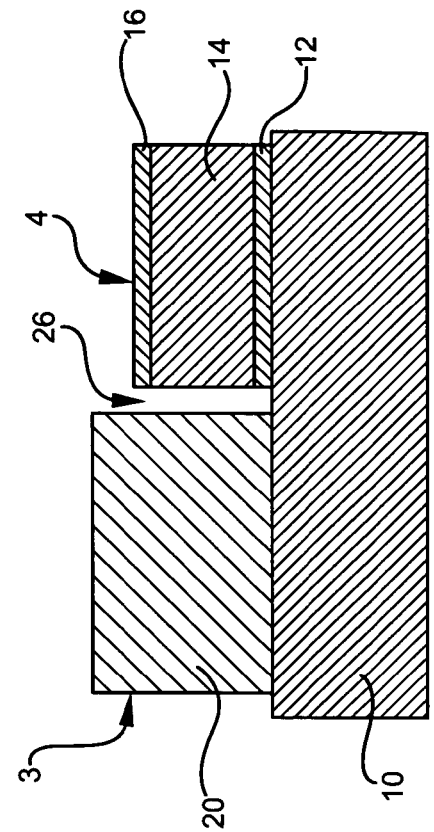
FIG. 17 is a cross-sectional view of the encircled dotted area "DD" of the magnetometer device of FIG. 13 according to an embodiment of the invention.

The piezoelectric sensor component 4 of the magnetometer device 1 of FIG. 11 is shown in the isolated view of FIG. 15. The piezoelectric sensor component 4, which comprises the TiPt bottom electrode 12, PZT layer 14, and Pt top electrode 16, senses the deformation of the MEMS resonator component 2 due to Lorentz forces. In FIG. 16, the top electrode bonds pads 23 are for the LF drive conductor component 3 (of FIG. 14) and the LF conductor bonds pads 22 are for the piezoelectric sensor component 4 (of FIG. 15). A cross-sectional view of the encircled dotted area "DD" of the magnetometer device of FIG. 13 is shown in FIG. 17, where an air gap 26 exists between the conductive material 20 of the LF drive conductor component 3 and the TiPt/PZT/Pt piezoelectric sensor component 4 thereby creating electrical isolation between the LF drive conductor component 3 and the TiPt/PZT/Pt piezoelectric sensor component 4. Each of the LF drive conductor component 3 and the TiPt/PZT/Pt piezoelectric sensor component 4 is mechanically coupled to the first SiO$_2$ layer 10. However, because the first SiO$_2$ layer 10 is insulative, there remains electrical isolation between the LF drive conductor component 3 and the TiPt/PZT/Pt piezoelectric sensor component 4. Without the electrical isolation, the drive function of the sensor (generation of the Lorentz forces) would be directly coupled to the sense function of the sensor (piezoelectric detection of the Lorentz forces). Piezoelectric materials can act as sensors (generation of electrical charge due to mechanical stress) and conversely as actuators (generation of mechanical strain due to electrical field). Therefore, without electrical isolation the drive signal would otherwise cause the TiPt/PZT/Pt piezoelectric sensor component 4 to actuate, and not sense.

Figure 19:
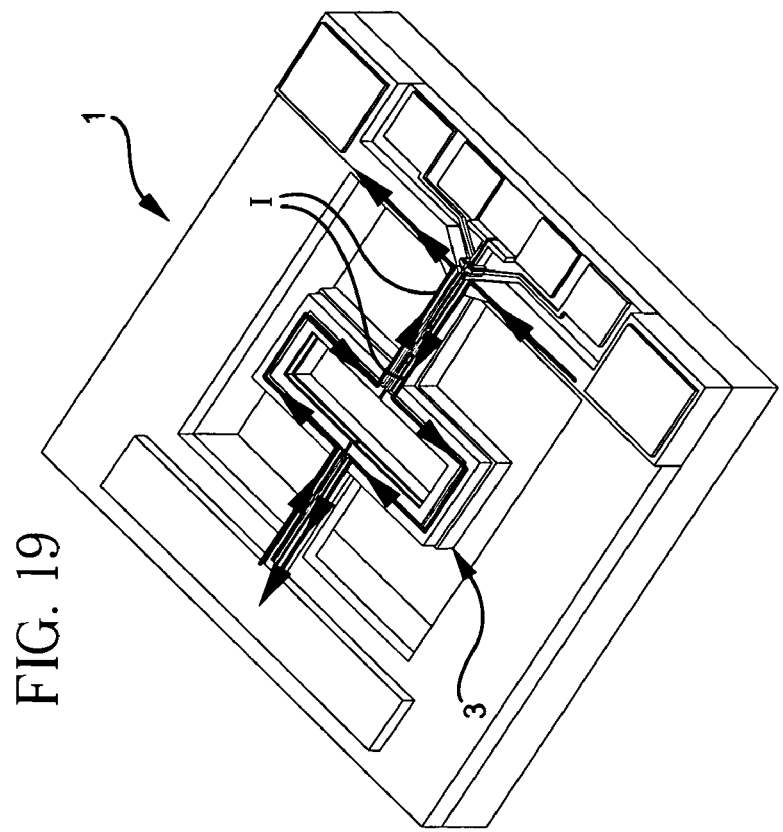
FIG. 19 is a perspective view of the magnetometer device of FIG. 11 during the application of an AC current, I, being applied to the Lorentz force conductor component of FIG. 14 according to an embodiment of the invention.
Figure 18:
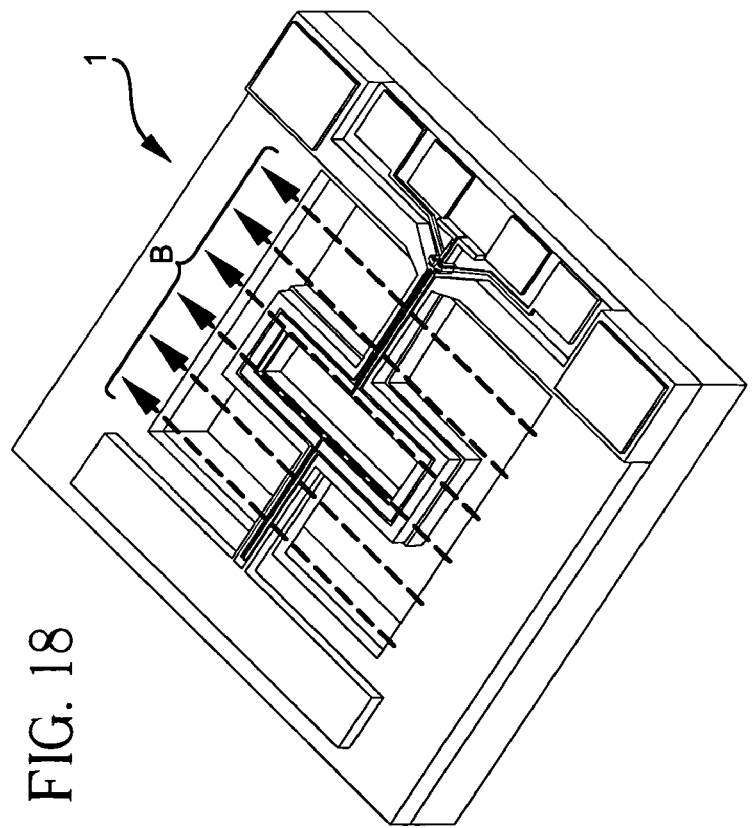
FIG. 18 is a perspective view of the magnetometer device of FIG. 11 in the presence of an external magnetic field, B, according to an embodiment of the invention.
Figure 20:
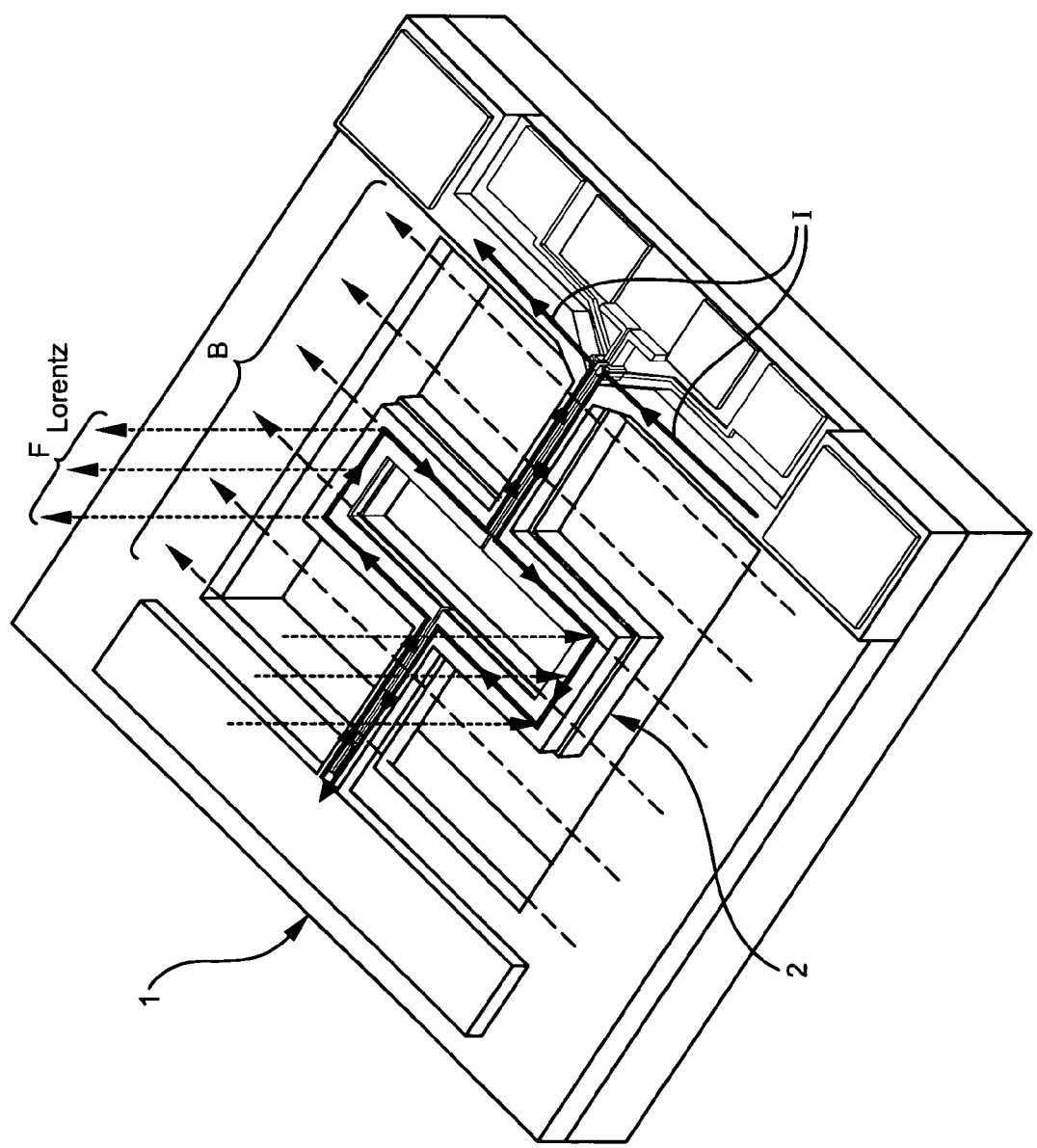
FIG. 20 is a perspective view of the magnetometer device of FIG. 11 illustrating the resulting Lorentz forces, $F_{Lorentz}$, during operation of the device in the manner illustrated in FIGS. 18 and 19 according to an embodiment of the invention.

FIGS. 18 through 20 illustrate the magnetometer device 1 in operation. As shown in FIG. 18, the magnetometer device 1 is placed in the presence of an external magnetic field, B (generally indicated by the series of arrows in FIG. 18 traversing the magnetometer device 1). Then, as shown in FIG. 16 and FIG. 19, an AC voltage source (not shown) is applied across the pair of electrode bond pads 23 to generate an AC current, I, which flows through the LF drive conductor component 3, looping around the perimeter therein. Next, as depicted in FIG. 20, the resulting Lorentz forces, $F_{Lorentz}$, are normal to both the current and magnetic field vectors. These Lorentz forces cause mechanical deformation in the MEMS resonator component 2. The AC drive current, I, is at a resonant frequency of the MEMS resonator component 2, which amplifies the deformation by the mechanical quality factor of the chosen resonant mode. The deformed piezoelectric produces an AC current that is proportional to the deformation. This, in turn, is proportional to the Lorentz forces, $F_{Lorentz}$, and hence the external magnetic field. The following analytical models demonstrate the validity of these concepts.

An experimental analytical model was developed to facilitate the choice of design variables used in accordance with the embodiments of the invention. The analytical model can accommodate simple geometries such as cantilevers, free-free, and clamped-clamped beams. The model approximates many of the designs; the torsional current loop designs in particular have resonant bending dominated modes that behave much like cantilevers. The following are the relevant variables employed in the following equations:

TABLE 1

Relevant Variables

| | |
|---|---|
| n | number of electrodes |
| b | electrode width |
| h | distance from the neutral axis to the midplane of the piezo |
| $e_{31}$ | piezoelectric stress constant |
| Q | resonator quality factor |
| $\lambda_I$ | Ith resonant mode number |
| $\Delta T_{max}$ | maximum allowable temperature of LF conductor |
| $\sigma_{con}$ | electrical conductivity of LF conductor |
| $\rho_{con}$ | mass density of LF conductor |
| $c_{con}$ | specific heat of LF conductor |
| $A_{con}$ | cross-sectional area of LF conductor |
| L | beam length |
| $\phi$ | constant depends on mechanical boundary conditions |
| $EI_{comp}$ | flexural rigidity of composite structure |
| $\mu$ | mass per unit length of composite structure |
| N | mechanical time constant multiplier |

The goal is to derive an expression for the current sensitivity of the device with respect to a static magnetic field (Eq. 1) due to the Lorentz force (Eq. 2). The piezoelectrically generated current generated can be expressed in terms of the angular deflection of the cantilevers free end due to the Lorentz force acting upon it (Eq. 3).

$$S_{mag} = \frac{PiezoCurrent}{MagneticFieldIntensity} = \frac{\dot{q}_{piezo}}{B} \quad \text{(Eq. 1)}$$

$$\vec{F}_{Lorentz\,max} = \vec{I}_{max} l \vec{B} \quad \text{(Eq. 2)}$$

$$\dot{q}_{piezo} = \theta_{res} b n \omega h e_{31} \quad \text{(Eq. 3)}$$

For a cantilever geometry, the angular deflection of the free end of the beam at resonance is expressed in terms of the distributed load acting upon it and the mechanical quality factor (Eq. 4). Substituting (Eq. 2) and (Eq. 4) into (Eq. 3), the piezoelectrically generated current due to a Lorentz force induced by a static magnetic field and an AC current at a mechanical resonance frequency of the cantilever beam is obtained (Eq. 5). Substituting the resonance frequency (Eq. 6) into (Eq. 5), dividing out the magnitude of the magnetic field, and simplifying, the continuous drive current sensitivity of the device (Eq. 7) is obtained.

$$\theta_{res} = \frac{F_{tot} L^2 Q}{6(EI)_{comp}} \quad \text{(Eq. 4)}$$

$$\dot{q}_{piezo} = \frac{nbh\omega e_{31} Q I_{max} B L^3}{6(EI)_{comp}} \quad \text{(Eq. 5)}$$

$$\omega_{res} = \frac{\lambda}{2\pi} \sqrt{\frac{(EI)_{comp}}{\mu L^4}} \quad \text{(Eq. 6)}$$

$$S_{mag\,Imax} = \frac{n \lambda_i b h e_{31} L Q I_{max}}{12\pi \sqrt{EI_{comp} \mu}} \quad \text{(Eq. 7)}$$

Ignoring heat transfer factors, the maximum drive current can be expressed in terms of the maximum temperature, the thermal material properties of the conductor, the cross-sectional area, and the duration of the application of the current (Eq. 8). The minimum pulse duration can be represented by a safety factor divided by the resonant quality factor and the resonant frequency (Eq. 9). Substituting (Eq. 8) and (Eq. 9) into (Eq. 7) and simplifying yields the expression for the pulsed drive current sensitivity of the device (Eq. 10).

$$I_{max} = \sqrt{\frac{\Delta T_{max} \sigma \rho c A_{con}^2}{t_{pulse}}} \quad \text{(Eq. 8)}$$

$$t_{pulse} \approx N \tau_{mech} = \frac{N}{Q \lambda_i \sqrt{\frac{EI_{comp}}{\mu L^4}}} \quad \text{(Eq. 9)}$$

$$S_{mag\,Pulse} = \frac{nbhe_{31}(\lambda_i Q)^{\frac{3}{2}} \sqrt{\Delta T_{max}(\sigma \rho c A^2)_{con}}}{\phi \pi (EI_{comp})^{\frac{1}{4}} \mu^{\frac{3}{4}} \sqrt{N}} \quad \text{(Eq. 10)}$$

The $EI_{comp}$ term in the previous equations is the bending stiffness or flexural rigidity of the composite cantilever structure. The area moment of inertia ($I_{comp}$) of a cross-section of the beam with respect to the y-axis of the composite beam is the summation of the sums of the moments of inertia of each layer and the product of each layer's cross-sectional area and the square of the distance from the neutral axis to the centroidal axis of each layer, as given by the parallel axis theorem. The composite modulus of elasticity ($E_{comp}$) is the summation of the products of volume fractions of each layer and the modulus of the corresponding layer. For a constant width beam, the composite bending stiffness is (Eq. 11). The h term in the previous equations is the distance between the center of the piezoelectric layer and the overall structure's neutral plane. The location of the neutral axis is found by dividing the summation of the products of the layer cross sectional areas and the distances from the centroids of the layers to some arbitrary reference axis by the cross-sectional area of the entire beam and the expression for h is given by (Eq. 12). The term $h_{piezo}$ is measured relative to the same arbitrary reference axis used to define the location of the neutral axis.

$$EI_{comp} = \frac{\Sigma(t_{layer}E_{layer})\Sigma(I_{layer} + A_{layer}d_{layer}^2)}{t_{beam}} \quad \text{(Eq. 11)}$$

$$h = \left|(h_{piezo}) - \left(\frac{\Sigma(A_{layer}y_{layer})}{A_{total}}\right)\right| \quad \text{(Eq. 12)}$$

The design provided by the embodiments of the invention mechanically couples the LF drive conductor component 3 (drive function) and the piezoelectric sensor component 4 (sense function) by means of attaching both components (LF drive conductor component 3 and piezoelectric sensor component 4) to a separate structure (i.e., the silicon dioxide base layer 10). Furthermore, the design provided by the embodiments of the invention electrically decouples LF drive conductor component 3 (drive function) and the piezoelectric sensor component 4 (sense function) by means of physically separating the LF drive conductor from the piezoelectric sensor component 4 using isolators 17.

In an alternative embodiment, a DC current may be applied to the LF drive conductor component 3. However, if an AC current is used, as described above, then the resonator quality factor, Q, amplifies the device sensitivity by as much as 10,000. The magnetic fields that can be sensed at a high Q resonant mode is approximately "Q" times smaller than at static conditions (i.e., DC drive). This means that the sensor is far superior at operating with a high Q as opposed to a low Q.

The embodiments of the invention provides a PZT MEMS resonant Lorentz force magnetometer 1 that avoids conventional design flaws and functions properly as a quasi-static or dynamic magnetic field sensor. Moreover, the magnetometer 1 is small in size (much less than a square centimeter), weight (milli-microgram mass), power consumption (in the milliwatt range), provides excellent sensor resolution (approximately 1 nanoTesla, possesses a large dynamic range (approximately 80 dB), and has a low cost of manufacturing. The magnetometer device 1 can measure 1 Tesla through 1 nanoTesla field strengths. The large dynamic range is attainable due to the ability to scale the LF drive current to prevent overdriving of the magnetometer device 1 in strong fields that would otherwise destroy the magnetometer device 1.

Figure 21:
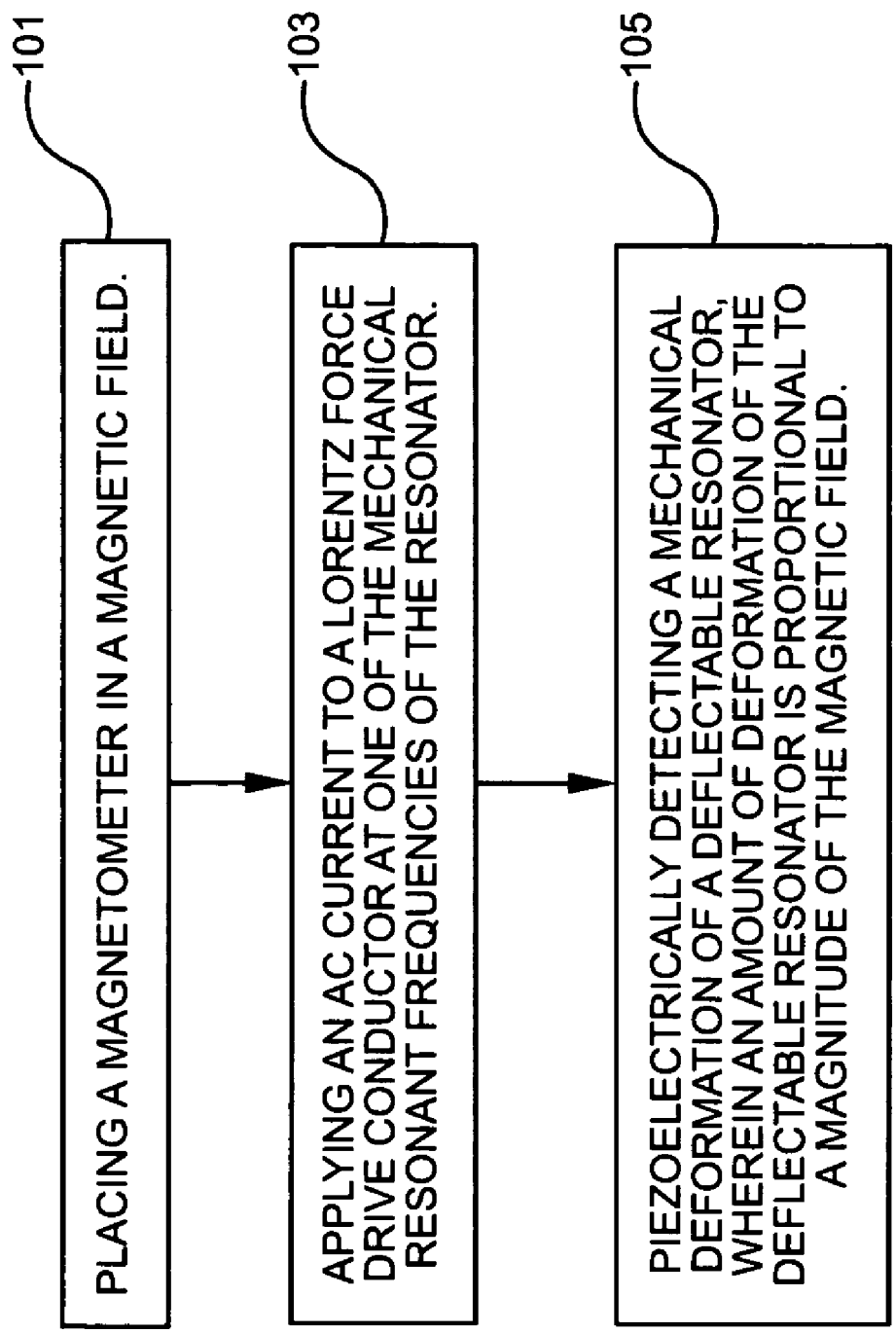
FIG. 21 is a flow diagram illustrating a preferred method according to an embodiment of the invention.

Another aspect of the invention is illustrated in the flowchart of FIG. 21, which includes descriptions which refer to components provided in FIGS. 1 through 20. FIG. 21 illustrates a method for detecting a magnetic field, B, using a magnetometer 1 comprising a deflectable resonator 2 comprising a base layer 10; a LF drive conductor 3 attached to the base layer 10; and a piezoelectric sensor 4 attached to the base layer 10 and electrically isolated from the LF drive conductor 3, wherein the method comprises placing (101) the magnetometer 1 in a magnetic field, B; applying (103) a current, I, to the LF drive conductor 3; and detecting (105) a mechanical deformation of the deflectable resonator 2, through the piezoelectrically generated signal of the piezoelectric sensor 4, wherein the amount of deformation of the deflectable resonator 2 is proportional to the piezoelectric signal which is then proportional to the magnitude of the magnetic field, B.

The deflectable resonator 2 comprises a torsional loop configuration according to one embodiment of the invention. Additionally, the LF drive conductor 3 comprises conductive material 20 configured for receiving the current, I, at a resonant frequency capable of causing the mechanical deformation of the deflectable resonator 2. Moreover, application of the current, I, in the presence of a magnetic field, B, causes formation of Lorentz forces, $F_{Lorentz}$, wherein the Lorentz forces, $F_{Lorentz}$, are in a plane normal to the current vector, I, and the magnetic field vector, B. Furthermore, the deflectable resonator 2 is mechanically deformed as a result of the formation of the Lorentz forces, $F_{Lorentz}$.

Moreover, the piezoelectric sensor 4 comprises a bottom electrode 12; a piezoelectric layer 14 over and adjacent to the bottom electrode 12; a top electrode 16 over and adjacent to the piezoelectric layer 14; and an isolator 17 electrically isolating the bottom electrode 12 from the top electrode 16. Also, the magnetometer 1 further comprises a first interconnect structure 23 connected to the LF drive conductor 3; and a second interconnect structure 22 connected to the piezoelectric sensor 4, wherein the second interconnect structure 22 is electrically isolated from the first interconnect structure 23.

The magnetometer 1 is capable of being utilized in several applications including quasi-static and dynamic magnetic field sensing for detection of ferrous objects by means of sensing the disturbances in the Earth's local magnetic field generated by the ferrous objects. Furthermore, the magnetometer 1 may be used for orientation sensing of projectiles used in military and non-military environments.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A configurable microelectromechanical system (MEMS) magnetometer comprising a deflectable resonator comprising:
    a base layer;
    a Lorentz force (LF) drive conductor attached to said base layer; and
    a piezoelectric sensor attached to said base layer and electrically isolated from said LF drive conductor wherein said MEMS system is capable of processing maximum drive current equivalent to the maximum current of the Lorentz force drive conductor.

2. The MEMS magnetometer of claim 1, wherein said deflectable resonator comprises a torsional loop configuration.

3. The MEMS magnetometer of claim 1, wherein said LF drive conductor comprises conductive material configured for receiving a current at a resonant frequency capable of causing mechanical deformation of said deflectable resonator at one or more of a plurality of resonant frequencies.

4. The MEMS magnetometer of claim 3, wherein said current causes formation of Lorentz forces in a presence of a magnetic field.

5. The MEMS magnetometer of claim 4, wherein said deflectable resonator is mechanically deformed as a result of the formation of said Lorentz forces.

6. The MEMS magnetometer of claim 1, wherein said piezoelectric sensor comprises:
   a bottom electrode;
   a piezoelectric layer over and adjacent to said bottom electrode;
   a top electrode over and adjacent to said piezoelectric layer; and
   an isolator electrically isolating said bottom electrode from said top electrode.

7. The MEMS magnetometer of claim 1, further comprising:
   a first interconnect structure connected to said LF drive conductor; and
   a second interconnect structure connected to said piezoelectric sensor, wherein said second interconnect structure is electrically isolated from said first interconnect structure.

8. The MEMS magnetometer of claim 1, wherein said electrical isolation further comprises a silicon dioxide isolator.

9. A method for detecting a magnetic field using a magnetometer comprising a deflectable resonator comprising a base layer; a Lorentz force (LF) drive conductor attached to said base layer; and a piezoelectric sensor attached to said base layer and electrically isolated from said LF drive conductor, said method comprising:
   placing said magnetometer in a magnetic field;
   applying an AC current corresponding to a mechanical resonant frequency of the resonator to said LF drive conductor; and
   detecting a mechanical deformation of said deflectable resonator with a piezoelectrically generated signal,
   wherein an amount of deformation of said deflectable resonator is proportional to a piezoelectric signal generated by said piezoelectric sensor, and wherein said piezoelectric signal is proportional to a magnitude of said magnetic field.

10. The method of claim 9, wherein said deflectable resonator comprises a torsional loop configuration.

11. The method of claim 9, wherein said LF drive conductor comprises conductive material configured for receiving said current at a resonant frequency capable of causing said mechanical deformation of said deflectable resonator.

12. The method of claim 11, wherein application of said current causes formation of Lorentz forces.

13. The method of claim 12, wherein said deflectable resonator is mechanically deformed as a result of the formation of said Lorentz forces, and wherein said piezoelectric sensor detects said mechanical deformation.

14. The method of claim 9, wherein said piezoelectric sensor comprises:
   a bottom electrode;
   a piezoelectric layer over and adjacent to said bottom electrode;
   a top electrode over and adjacent to said piezoelectric layer; and
   an isolator electrically isolating said bottom electrode from said top electrode.

15. The method of claim 9, wherein said magnetometer further comprises:
   a first interconnect structure connected to said LF drive conductor; and
   a second interconnect structure connected to said piezoelectric sensor, wherein said second interconnect structure is electrically isolated from said first interconnect structure.

16. The method of claim 9, further comprising forming said isolator from silicon dioxide.

* * * * *